United States Patent

Vasquez et al.

[11] Patent Number: 5,304,538
[45] Date of Patent: Apr. 19, 1994

[54] EPITAXIAL HETEROJUNCTIONS OF OXIDE SEMICONDUCTORS AND METALS ON HIGH TEMPERATURE SUPERCONDUCTORS

[75] Inventors: Richard P. Vasquez, Altadena; Brian D. Hunt, Pasadena; Marc C. Foote, Montrose, all of Calif.

[73] Assignee: The United States of America as repeated by the Administrator of the National Aeronautics and Space Administration, Washington, D.C.

[21] Appl. No.: 852,620

[22] Filed: Mar. 11, 1992

[51] Int. Cl.⁵ ............... H01L 39/22; B05D 5/12; H01B 12/00
[52] U.S. Cl. ...................... 505/190; 257/35; 257/33; 505/702; 505/785; 427/62
[58] Field of Search .......... 357/5; 505/1, 702; 427/62, 63; 257/33, 35

[56] References Cited

U.S. PATENT DOCUMENTS

| | | | |
|---|---|---|---|
| 4,495,510 | 1/1985 | Roth et al. | 357/5 |
| 4,837,609 | 6/1989 | Gurvitch et al. | 357/67 |
| 4,905,319 | 2/1990 | Schroder et al. | 357/65 |
| 4,921,833 | 5/1990 | Takano | 505/1 |
| 4,940,693 | 7/1990 | Shappirio et al. | 505/1 |
| 4,965,244 | 10/1990 | Weaver et al. | 505/1 |
| 4,968,664 | 11/1990 | Sugihara et al. | 505/1 |
| 4,970,395 | 11/1990 | Kruse et al. | 357/5 |
| 5,096,878 | 3/1992 | Hoshino et al. | 505/1 |
| 5,130,294 | 7/1992 | Char | 505/1 |
| 5,145,830 | 9/1992 | Kohiki et al. | 357/5 |

FOREIGN PATENT DOCUMENTS

| | | | |
|---|---|---|---|
| 2-87688 | 3/1990 | Japan | 257/35 |
| 2-94678 | 4/1990 | Japan | 357/5 |

*Primary Examiner*—Rolf Hille
*Assistant Examiner*—Mahshid Saadat
*Attorney, Agent, or Firm*—John H. Kusmiss; Thomas H. Jones; Guy M. Miller

[57] ABSTRACT

Epitaxial heterojunctions formed between high temperature superconductors and metallic or semiconducting oxide barrier layers are provided. Metallic perovskites such as $LaTiO_3$, $CaVO_3$, and $SrVO_3$ are grown on electron-type high temperature superconductors such as $Nd_{1.85}Ce_{0.15}CuO_{4-x}$. Alternatively, transition metal bronzes of the form $A_xMO_3$ are epitaxially grown on electron-type high temperature superconductors. Also, semiconducting oxides of perovskite-related crystal structures such as $WO_3$ are grown on either hole-type or electron-type high temperature superconductors.

22 Claims, 1 Drawing Sheet

EPITAXIAL HETEROJUNCTIONS OF OXIDE SEMICONDUCTORS AND METALS ON HIGH TEMPERATURE SUPERCONDUCTORS

ORIGIN OF THE INVENTION

The invention described herein was made in the performance of work under a NASA contract, and is subject to the provisions of Public Law 96-517 (35 U.S.C. Section 202) in which the Contractor has elected not to retain title.

TECHNICAL FIELD

The invention relates to proximity-effect solid state devices having epitaxial heterojunctions between high temperature superconductors and barrier layers.

BACKGROUND ART

Various superconductor devices, such as super-conducting quantum interference devices (SQUIDs), include a heterojunction formed between a superconducting layer and a second layer which is an insulator for tunneling devices, or a metal or semiconductor for proximity effect devices.

More specifically, the Josephson junction comprises a sandwich structure having a barrier layer formed between two superconductors, i.e., a superconductor-insulator-superconductor (SIS) junction, a superconductor-normal metal-superconductor (SNS) junction, or a superconductor-semiconductor-superconductor (SuSmSu) junction. Alternatively, the Josephson junction includes a constriction forming a superconducting microbridge. In either case, a weak link is provided between two superconductors to allow electrons to tunnel or otherwise conduct between the two superconductors resulting in the ac Josephson effect, whereby an oscillating current is induced by the application of a dc voltage across the junction.

Conventionally, such superconducting junctions are formed with low temperature superconductors. Examples of such junctions include NbN-MgO-NbN and Nb-AlO$_x$-Nb SIS junctions, which have been used as mixer elements in submillimeter wave heterodyne receivers.

The fabrication of similar SIS junctions utilizing high temperature superconductors has proved challenging. To form an epitaxial heterojunction, the barrier material must have a crystal structure and lattice constant closely matching those of the superconducting layers. High quality devices also require a fully-developed energy gap within one coherence length of the superconductor-insulator interfaces. Since high temperature superconductors have coherence lengths of only a few angstroms, interfaces which are of a high quality on an atomic scale are essential, thus placing stringent requirements on the fabrication of SIS junctions utilizing high temperature superconducting materials.

Furthermore, high temperature superconducting materials have various undesirable properties not found in low temperature superconductors, so that low temperature superconductor device fabrication techniques cannot be successfully applied to the fabrication of high temperature superconductor devices. For example, high temperature superconductors react with most commonly used metals and semiconductors, thus preventing the formation of an epitaxial junction.

Previously, attempts have been made to form SIS epitaxial heterojunctions using high temperature superconductors and insulating oxides having perovskite or distorted perovskite crystal structures.

Table I provides crystal lattice structure parameters for some high temperature superconductor materials.

TABLE I

| Superconductor (Hole-Type) | a (Å) | b (Å) | c (Å) | Structure |
|---|---|---|---|---|
| YBa$_2$Cu$_3$O$_7$ | 3.82 | 3.89 | 11.68 | orthorhombic |
| Bi$_2$Sr$_2$CaCu$_2$O$_{8+x}$ | 3.83 | 3.83 | 30.8 | orthorhombic |
| Tl$_2$Ba$_2$CaCu$_2$O$_{8+x}$ | 3.855 | — | 29.35 | body-centered tetragonal |

Table II provides crystal lattice parameters for possible insulator barrier materials. As can be seen from Tables I and II, the lattice parameters of the insulators adequately match the lattice parameters of the high temperature superconductor materials.

TABLE II

| Barrier (Insulator) | a (Å) | b (Å) | c (Å) | Structure |
|---|---|---|---|---|
| SrTiO$_3$ | 3.905 | — | — | cubic (perovskite) |
| LaAlO$_3$ | 3.78 (pseudo cubic) | — | — | monoclinic (distorted perovskite) |
| KTaO$_3$ | 3.99 | — | — | cubic (perovskite) |
| PrGaO$_3$ | 3.863 (pseudo cubic) | — | — | orthorhombic (distorted perovskite) |

However, despite an adequate lattice match, efforts to fabricate heterojunctions between these materials have been unsuccessful, most likely due to the short coherence length in the high temperature superconductors.

Efforts to fabricate epitaxial SuSmSu junctions have also been unsatisfactory. High temperature superconductors react with common semiconductors, such as Si, thus preventing the formation of a heterojunction. Therefore, efforts to fabricate SuSmSu junctions have focused on oxide semiconductors, which are less likely to be reactive, as the barrier material. In particular, oxide semiconductors such as PrBa$_2$Cu$_3$O$_7$ and Nb-doped SrTiO$_3$ have been investigated. These oxide semiconductors have a proper lattice match with the high temperature superconductor YBa$_2$Cu$_3$O$_7$. However, heterojunctions formed from these oxide semiconductors exhibit nonideal current-voltage (I-V) characteristics. The unsatisfactory results are likely caused either by defects in the barrier layer, such as pinholes or other structural inhomogeneities, or by poor interfacial quality.

SNS junctions have been investigated as an alternative to the junctions discussed above. In an SNS junction, superconductivity is induced in a normal metal barrier layer via the "proximity effect," wherein a weak conductive link, analogous to a tunneling link in an SIS junction, is formed across the barrier. Whereas tunnel barrier thicknesses are typically limited to ~20-30Å for devices with practical current densities, the normal metal bridge length is determined by the normal metal coherence length, which can be significantly longer (~100-1000Å). A device using a metallic barrier can therefore have larger dimensions. Fabrication of SNS junctions is thus easier and the requirements for material quality are not as stringent.

However, the cuprate superconductors react with most normal metals to oxidize the metals, thus destroying superconductivity in the interfacial region.

Thus, the fabrication of a high quality SNS junction using only high temperature superconductors requires using a barrier metal which does not react with the superconductor. Further, the barrier metal must be lattice matched to the superconductor at temperatures ranging from the growth temperature of the high temperature superconductor (>700° C.) down to device operating temperatures (<−200° C.). A metal which meets these requirements has not heretofore been identified.

Thus, efforts to form epitaxial heterojunction devices using high temperature superconductors have been largely unsatisfactory. Conventional insulators have not yielded effective SIS junctions because of problems resulting from the short coherence length of the high temperature superconductors, as well as interfacial reactions occurring at the elevated temperature required for growth of the counterelectrode. Conventional semiconductors have not yielded effective SuSmSu junctions with high temperature superconductors because of structural inhomogeneities occurring in the barrier layer or because of poor interfacial quality between the barrier and the superconductor. Finally, conventional metals have not yielded effective SNS junctions with high temperature superconductors because most conventional metals react with high temperature superconductors.

Accordingly, it can be appreciated that there is a need to provide new combinations of materials to achieve epitaxial heterojunctions using high temperature superconductors.

STATEMENT OF THE INVENTION

Therefore, it is an object of the invention to provide an effective epitaxial heterojunction formed between a high temperature superconductor and a barrier layer.

It is another object of the invention to provide an effective Josephson junction device having high temperature superconductors using barrier materials which have not been utilized in the current state-of-the-art.

These and other objects of the invention are achieved by forming a heterojunction between a pair of high temperature superconductors connected by an epitaxial barrier layer composed of a material selected from the group consisting of metallic perovskites or transition metal bronzes. Alternatively, the barrier material comprises a semiconducting oxide having a perovskite-related crystal structure such as $WO_3$.

In one embodiment, the high temperature superconductors are composed of an electron-type superconductor such as $Nd_{1.85}Ce_{0.15}CuO_{4-x}$, and the metallic perovskite is either $LaTiO_3$, $CaVO_3$, or $SrVO_3$. Alternatively, the barrier layer is composed of a transition metal bronze of the form $A_xMO_3$ wherein A is an alkaline earth or a rare earth, x is less than 1, and M is either W, V, Mo, Ta, or Nb. Also alternatively, the high temperature superconductor is either an electron-type superconductor or a hole-type superconductor, and the barrier layer is composed of a semiconducting oxide having a perovskite-related crystal structure such as $WO_3$.

In accordance with the invention, the aforementioned epitaxial heterojunctions can be implemented within a wide variety of device geometries. One such device geometry, an edge-geometry Josephson junction device, includes a first high temperature superconducting layer formed on the top surface of an insulating substrate. An insulating layer is formed on the top surface of the first high temperature superconducting layer. Both the superconductor and insulator layers are removed from a portion of the substrate, and a barrier layer is deposited on the exposed edge of the first high temperature superconducting layer. A second high temperature superconducting layer is formed on the barrier layer. A portion of the second superconductor, barrier, and insulator layers is removed to allow an electrical contact to be made to the first superconductor layer and to define the active device area. The barrier layer is composed of a metallic perovskite, a transition metal bronze, or $WO_3$.

Thus, the invention provides various combinations of materials for the purpose of forming an effective epitaxial heterojunction using high temperature superconducting materials. The invention is provided to achieve an effective heterojunction despite the high reactivity and short coherence length of high temperature superconductors by forming the barrier layer from a metallic or semiconducting oxide rather than from a conventional insulator.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE INVENTION

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide an epitaxial heterojunction device formed with high temperature superconductors.

Figure 1:
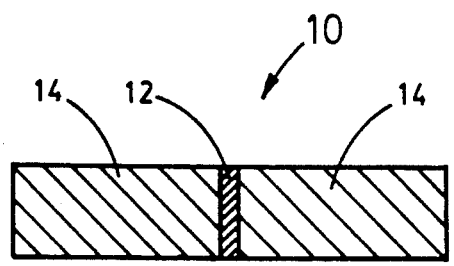
FIG. 1 provides a schematic cross-sectional view of an epitaxial heterojunction constructed in accordance with the invention.

Referring to FIG. 1, various preferred embodiments of the invention will now be described. In FIG. 1, an epitaxial heterojunction 10 is shown having a barrier layer 12 separated between opposing high temperature superconducting layers 14.

Barrier material 12, chosen such that the crystal lattice structure substantially matches the crystal lattice structure of adjacent high temperature superconductors 14, is epitaxially grown on a first high temperature superconductor 14. A second high temperature superconductor 14 is epitaxially grown on the barrier material 12.

In one embodiment, barrier layer 12 consists of a metallic perovskite, and the high temperature superconductor consists of an electron-type superconductor. As will be discussed below, suitable metallic perovskites for forming barrier layer 12 include LaTiO$_3$, CaVO$_3$, and SrVO$_3$. A suitable electron-type high temperature superconductor for forming opposing layers 14 is Nd$_{1.85}$Ce$_{0.15}$CuO$_{4-x}$, where x is less than 0.1.

In accordance with an alternative embodiment, barrier layer 12 consists of a semiconducting oxide with a perovskite-related crystal structure such as WO$_3$. In this embodiment, superconducting layers 14 may consist of either a hole-type or an electron-type high temperature superconductor, including YBa$_2$Cu$_3$O$_7$, Bi$_2$Sr$_2$CaCu$_2$O$_{8+x}$, and Tl$_2$Ba$_2$CaCu$_2$O$_{8+x}$.

In accordance with another embodiment, barrier layer 12 consists of a transition metal bronze of the form A$_x$MO$_3$, and high temperature superconductors 14 consists of electron-type superconductors. As will be described below, suitable transition metal bronzes include Y$_{0.09}$WO$_3$ and Ca$_{0.02}$WO$_3$.

The various combinations of materials allow for the formation of epitaxial heterojunctions using high temperature superconductors, despite the high reactivity and short coherence length inherent in high temperature superconductor devices.

The first embodiment wherein an electron-type superconductor is employed in combination with a metallic perovskite will now be described in greater detail.

High temperature superconductor materials having hole-type conductivity, such as YBa$_2$Cu$_3$O$_7$, Bi$_2$Sr$_2$CaCu$_2$O$_{8+x}$, and Tl$_2$Ba$_2$CaCu$_2$O$_{8+x}$, must be grown in an oxidizing atmosphere. Accordingly, attempts to fabricate epitaxial heterojunctions have focused on barrier materials which may be grown in an oxidizing atmosphere, such as insulating or semiconducting perovskites.

The invention, however, in its first embodiment, provides an epitaxial heterojunction using an electron-type high temperature superconductor, which may be grown in a reducing atmosphere. To this end, the electron-type high temperature superconductor Nd$_{1.85}$Ce$_{0.15}$CuO$_{4-x}$ is used in combination with a metallically-conducting perovskite. Likewise, the metallically-conducting perovskites may be grown in a reducing atmosphere.

Generally, the perovskite structure is a cubic crystal structure. The formula for a perovskite is represented by ABO$_3$, in which A is a large basic cation (typically an alkali metal, alkaline earth, or rare earth ion), and B is a smaller cation (typically either a Group III or a transition metal ion).

Table III provides the lattice parameters for Nd$_{1.85}$Ce$_{0.15}$CuO$_{4-x}$, wherein x is typically less than 0.1. Table IV provides the lattice parameters for suitable metallic perovskites LaTiO$_3$, CaVO$_3$, and SrVO$_3$.

As can be seen by a comparison of Tables III and IV, the lattice parameters of the metallic perovskites adequately match the lattice parameters of Nd$_{1.85}$Ce$_{0.15}$CuO$_{4-x}$ such that an effective epitaxial junction may be formed.

TABLE III

| Superconductor (Electron-Type) | a (Å) | b (Å) | c (Å) | Structure |
|---|---|---|---|---|
| Nd$_{1.85}$Ce$_{0.15}$CuO$_{4-x}$ | 3.95 | — | 12.1 | body-centered tetragonal |

TABLE IV

| Barrier (Metallic Perovskite) | a (Å) | b (Å) | c (Å) | Structure |
|---|---|---|---|---|
| LaTiO$_3$ | 3.934 | — | — | cubic (perovskite) |
| CaVO$_3$ | 3.767 | — | — | cubic (perovskite) |
| SrVO$_3$ | 3.838 | — | — | cubic (perovskite) |

The invention, in its second embodiment, provides epitaxial heterojunctions between a high temperature superconductor and a barrier composed of a semiconducting material, WO$_3$. WO$_3$ has a crystal structure similar to, but slightly distorted from, the general perovskite structure described above. WO$_3$, an n-type semiconductor when oxygen-deficient (i.e., WO$_{3-x}$, x<0.5), may be epitaxially grown on either a hole-type or an electron-type superconductor in either an oxidizing or a reducing atmosphere. Other semiconductors with perovskite-related crystal lattice structure may also be effective.

At room temperature, WO$_3$ has a monoclinic crystal structure, whereas cuprate high temperature superconductors have tetragonal or orthorhombic crystal structures. The difference in lattice structures would seem to eliminate WO$_3$ as a candidate for epitaxial growth on high temperature superconductor materials. However, WO$_3$ does, in fact, have a good lattice match to high temperature superconductor materials, as discussed below.

Table V provides the lattice parameters for WO$_3$ for a variety of temperature ranges.

TABLE V

| Barrier (Semiconducting) | a (Å) | b (Å) | c (Å) | Structure |
|---|---|---|---|---|
| WO$_3$ | 3.65 (a/2) | 3.77 (b/2) | 3.844 (c/2) | monoclinic (17°–320° C.) (distorted ReO$_3$) |
| | 3.69 (a/2) | 3.77 (b/2) | 3.89 | orthorhombic (320°–720° C.) |
| | 3.65 (a/2) | 3.76 (b/2) | 3.845 (c/2) | triclinic (17° to −40° C.) |
| | 3.69 (a/2) | 3.69 (b/2) | 3.835 (c/2) | triclinic (< −40° C.) |

As can be seen from Table V, the lattice parameters b/2 and c/2 of WO$_3$ closely match the a and b axes of high temperature superconductor materials described in Tables I and III over a wide temperature range despite the several phase changes.

Although the phase changes appear at first glance to involve transitions between very different crystal structures, all of the phases are, in fact, only slight distortions from cubic structures, such that an epitaxial junction may be formed with a cuprate high temperature superconductor.

For example, in the monoclinic and triclinic phases, deviations from an ideal 90-degree corner angle of a cubic structure are less than ~1.5 degrees, and usually much less. The unit cell volumes in the various phases differ by only ~1%. Furthermore, even these small changes in crystal structure may be suppressed by forming a WO$_3$ material which is oxygen deficient by as little as ~0.01%, as would be expected for the conditions necessary for growth of the high temperature superconductor materials.

The invention, in its third embodiment, provides epitaxial heterojunctions between high temperature superconductors and a class of materials called metallic bronzes. The metallic bronzes, which derive their name from their metallic appearance and conductivity, have crystal structures which are intermediate between the perovskite and $WO_3$ structures discussed above. The metallic bronzes may be represented by $A_xMO_3$, wherein A is an alkali metal, alkaline earth, or rare earth, x is less than 1, and M is W, V, Mo, Ta, Nb.

The A cations are randomly distributed on the appropriate sites and x can vary widely. Transition metal bronzes may be considered as cation-deficient perovskites for x large, e.g. $Na_{0.95}WO_3$, or as $WO_3$ structure materials (with interstitial cation impurities) for x small.

Table VI provides the lattice parameters for exemplary transition metal bronze materials $Y_{0.09}WO_3$ and $Ca_{0.02}WO_3$.

TABLE VI

| Barrier (Transition Metal Bronze) | a (Å) | b (Å) | c (Å) | Structure |
|---|---|---|---|---|
| $Y_{0.09}WO_3$ | 3.800 | — | — | cubic |
| $Ca_{0.02}WO_3$ | 3.67 (a/2) | 3.71 (b/2) | 3.85 | orthorhombic |

The transition metal bronzes exhibit a good lattice match to electron-type high temperature superconductor materials, as shown by a comparison of the two examples in Table VI with the electron-type high temperature superconductor material of Table III. As with the perovskite oxide metals, the transition metal bronzes are prepared under reducing conditions and, hence, form effective heterojunctions with the electron-type high temperature superconductor materials.

Figure 2:
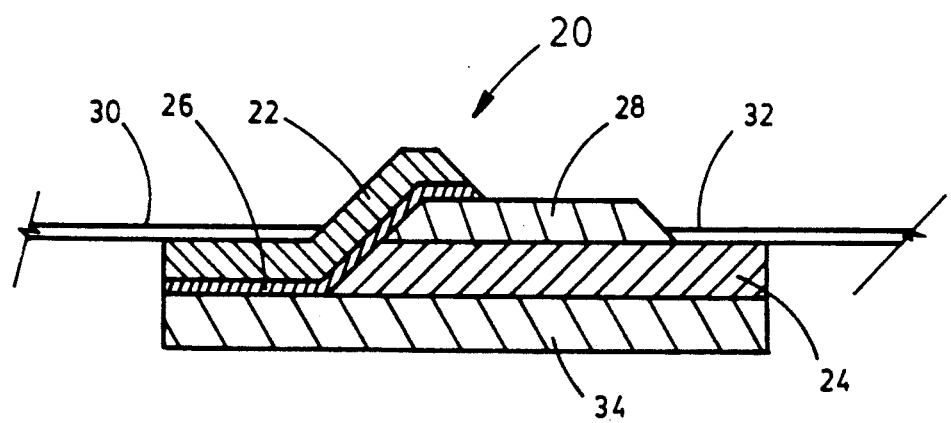
FIG. 2 provides a schematic cross-sectional view of an exemplary Josephson junction device constructed in accordance with an embodiment of the invention.

In accordance with an embodiment of the invention, the above-described epitaxial heterojunctions are formed within a wide variety of superconductor device geometries. Referring to FIG. 2, one such device geometry, an edge junction device, will be described. The Josephson junction device 20 includes first and second high temperature superconducting layers, 22 and 24 respectively, separated by a barrier layer 26. An insulator, such as magnesium oxide MgO 28, is formed along a top portion of the second high temperature superconducting layer 24. A metallic contact 30, preferably consisting of gold, connects the first high temperature superconductor to a voltage source (not shown). A second metallic contact 32, also preferably consisting of gold, connects the second high temperature superconductor to the voltage source. The various layers are preferably grown or otherwise formed on an insulating substrate 34 such as $LaAlO_3$ or $SrTiO_3$.

Josephson junction 20 is used in the same manner as conventional Josephson junction devices. However, by forming high temperature superconducting junctions from the combinations of novel materials described above, the Josephson junction device can operate effectively at higher temperatures.

The epitaxial heterojunctions of the invention may be formed by conventional techniques such as laser ablation.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

We claim:
1. A superconducting device comprising:
a first high temperature superconductor;
a barrier layer epitaxially grown on said first superconductor; and
a second high temperature superconductor epitaxially grown on said barrier layer;
said barrier layer being composed of a material selected from a group consisting of noninsulator metallic perovskite structures, transition metal bronzes, and $WO_3$.
2. The superconducting device of claim 1, wherein said noninsulator metallic perovskite structures have the formula $ABO_3$, where A is a first cation and B is a second cation.
3. The superconducting device of claim 1, wherein the first and second high temperature superconductors are electron-type high temperature superconductors.
4. The superconducting device of claim 2, wherein the barrier is composed of $LaTiO_3$.
5. The superconducting device of claim 2, wherein the barrier is composed of $CaVO_3$.
6. The superconducting device of claim 2, wherein the barrier is composed of $SrVO_3$.
7. The superconducting device of claim 3, wherein the electron-type high temperature superconductors are composed of $Nd_{1.85}Ce_{0.15}CuO_{4-x}$, where x is less than 0.1.
8. The superconducting device of claim 1, wherein the barrier is composed of a transition metal bronze of the form $A_xMO_3$ wherein A is selected from the group consisting of alkali metals, alkaline earths, and rare earths, and wherein x is less than 1 and wherein M is selected from the group consisting of W, V, Mo, Ta, and Nb.
9. The superconducting device of claim 8, wherein the barrier is composed of $Y_{0.09}WO_3$.
10. The superconducting device of claim 8, wherein the barrier is composed of $Ca_{0.02}WO_3$.
11. The superconducting device of claim 1, wherein said barrier is composed of $WO_3$.
12. An edge-geometry Josephson junction device comprising:
an insulating substrate;
a first high temperature superconducting layer grown on a top surface of the substrate;
an insulating layer grown on a top surface of the first high temperature superconducting layer;
a barrier layer extending along an edge of the first high temperature superconducting layer; and
a second high temperature superconducting layer grown on a top surface of the barrier layer;
said barrier layer being composed of a material selected from a group consisting of noninsulator metallic perovskite structures, transition metal bronzes, and $WO_3$.
13. A superconducting device comprising:
a first high temperature superconductor;
a barrier layer epitaxially grown on said first superconductor; and
a second high temperature superconductor epitaxially grown on said barrier layer;
said barrier layer being composed of a material having a noninsulator metallic perovskite structure of formula $ABO_3$, where A is a first cation and B is a second cation.

14. The superconducting device of claim 13, wherein the first and second high temperature superconductors are electron-type high temperature superconductors.

15. The superconducting device of claim 14, wherein the electron-type high temperature superconductors are composed of $Nd_{1.85}Ce_{0.15}CuO_{4-x}$, where x is less than 0.1.

16. A superconducting device comprising:
a first high temperature superconductor;
a barrier layer epitaxially grown on said first superconductor; and
a second high temperature superconductor epitaxially grown on said barrier layer;
said barrier layer being composed of a material selected from the group consisting of $LaTiO_3$, $CaVO_3$, and $SrVO_3$.

17. The superconducting device of claim 16, wherein the first and second high temperature superconductors are electron-type high temperature superconductors.

18. The superconducting device of claim 17, wherein the electron-type high temperature superconductors are composed of $Nd_{1.85}Ce_{0.15}CuO_{4-x}$, where x is less than 0.1.

19. A superconducting device comprising:
a first high temperature superconductor;
a barrier layer epitaxially grown on said first superconductor; and
a second high temperature superconductor epitaxially grown on said barrier layer;
said barrier layer being composed of a transition metal bronze of the form $A_xMO_3$ wherein A is selected from the group consisting of alkali metals, alkaline earths, and rare earths, and wherein x is less than 1 and wherein M is selected from the group consisting of W, V, Mo, Ta, and Nb.

20. The superconducting device of claim 19 wherein the barrier is composed of $Y_{0.09}WO_3$.

21. The superconducting device of claim 19 wherein the barrier is composed of $Ca_{0.02}WO_3$.

22. A superconducting device comprising:
a first high temperature superconductor;
a barrier layer epitaxially grown on said first superconductor; and
a second high temperature superconductor epitaxially grown on said barrier layer;
said barrier layer being composed of $WO_3$.

* * * * *